(12) United States Patent
Sandhu et al.

(10) Patent No.: US 7,453,134 B2
(45) Date of Patent: Nov. 18, 2008

(54) INTEGRATED CIRCUIT DEVICE WITH A CIRCUIT ELEMENT FORMED ON AN ACTIVE REGION HAVING ROUNDED CORNERS

(75) Inventors: Sukesh Sandhu, Boise, ID (US); Kevin Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/652,993

(22) Filed: Jan. 12, 2007

(65) Prior Publication Data
US 2007/0114633 A1 May 24, 2007

Related U.S. Application Data

(62) Division of application No. 11/136,823, filed on May 25, 2005, now Pat. No. 7,179,717.

(51) Int. Cl.
*H01L 29/00* (2006.01)
(52) U.S. Cl. .............................. 257/501; 257/E21.549; 257/E21.55
(58) Field of Classification Search .................. 257/501, 257/E21.549, E21.55
See application file for complete search history.

(56) References Cited

U.S. PATENT DOCUMENTS

| | | | |
|---|---|---|---|
| 6,235,643 B1 | 5/2001 | Mui et al. | |
| 6,245,684 B1 | 6/2001 | Zhao et al. | |
| 6,417,047 B1 * | 7/2002 | Isobe | 438/258 |
| 6,509,232 B1 * | 1/2003 | Kim et al. | 438/264 |
| 6,541,382 B1 | 4/2003 | Cheng et al. | |
| 6,602,745 B2 | 8/2003 | Thwaite et al. | |
| 6,627,506 B2 | 9/2003 | Kuhn et al. | |
| 6,664,592 B2 | 12/2003 | Inumiya et al. | |
| 6,723,617 B1 | 4/2004 | Choi | |
| 6,740,559 B2 | 5/2004 | Higuchi | |
| 6,818,526 B2 | 11/2004 | Mehrad et al. | |
| 6,933,238 B2 | 8/2005 | Asakawa | |
| 2002/0086497 A1 | 7/2002 | Kwok | |
| 2002/0094650 A1 | 7/2002 | Thwaite et al. | |
| 2004/0071008 A1 * | 4/2004 | Chen et al. | 365/145 |
| 2004/0126990 A1 | 7/2004 | Ohta | |
| 2004/0178447 A1 | 9/2004 | Yeo et al. | |
| 2004/0191994 A1 | 9/2004 | Williams et al. | |
| 2005/0287741 A1 * | 12/2005 | Ding | 438/257 |

* cited by examiner

*Primary Examiner*—Trung Dang
(74) *Attorney, Agent, or Firm*—Leffert Jay & Polglaze P.A.

(57) ABSTRACT

An integrated circuit device has a substrate with first and second portions. One or more first active regions are formed in the first portion of the substrate. Each of the one or more first active regions has rounded corners. One or more first circuit elements are formed on the one or more first active regions after the corners of the one or more first active regions have been rounded. One or more second active regions are formed in the second portion of the substrate. One or more second circuit elements are formed on the one or more second active regions.

21 Claims, 6 Drawing Sheets

INTEGRATED CIRCUIT DEVICE WITH A CIRCUIT ELEMENT FORMED ON AN ACTIVE REGION HAVING ROUNDED CORNERS

RELATED APPLICATION

This application is a divisional of U.S. application Ser. No. 11/136,823 titled "METHODS OF FORMING INTEGRATED CIRCUIT DEVICES," filed May 25, 2005 now U.S. Pat. No. 7,179,717, which application is assigned to the assignee of the present invention and the entire contents of which are incorporated herein by reference.

TECHNICAL FIELD OF THE INVENTION

The present invention relates generally to integrated circuit devices and in particular the present invention relates to methods of forming integrated circuit devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed on semiconductor substrates using semiconductor fabrication methods. The array of memory cells is disposed on the substrate. Isolation regions formed in the substrate within the array, e.g., shallow trench isolation, provide voltage isolation on the memory array by acting to prevent extraneous current flow through the substrate between the memory cells. Various memory devices include passive elements, such as capacitors, and/or active elements, such as transistors, that are formed in the periphery, such as for accessing, programming, and erasing the memory cells, e.g., select circuitry having high voltage pumps, etc. Isolation regions formed in the substrate at the periphery provide isolation at the periphery by acting to prevent extraneous current from flowing through the substrate between the passive and/or active elements and the memory array.

Isolation regions are normally formed by forming a hard mask layer over the substrate, patterning the hard mask to define regions of the substrate for removal, removing the substrate material to form trenches in the substrate, and filling the trenches with isolation material to form the isolation regions. One problem with the fabrication of the trenches is the formation of sharp corners in the substrate near an upper surface of the semiconductor substrate adjacent the trenches. These sharp corners may carry stronger electric fields that may cause problems when later forming active regions on either side of the trench. For example, when forming a transistor adjacent to the trench, a gate insulating oxide layer may be grown over the substrate and over the trench, because of the sharp corners, the gate oxide layer cannot be grown with a uniform thickness because it becomes too thin over the sharp corners. The thin gate oxide layer may break down if subjected to a high electric field.

Sharp top corners also cause a problem when filling the trench with an isolation material, e.g., using a high-density-plasma (HDP) chemical-vapor-deposition (CVD) process. HDP CVD processes subject the structure to plasma that also induces an electric field around the sharp corners that causes a non-uniform deposition process and that may create gaps or voids in the isolation material. Therefore, the sharp corners are often rounded.

For the reasons stated above, and for other reasons stated below which will become apparent to those skilled in the art upon reading and understanding the present specification, there is a need in the art for alternatives for rounding the sharp corners that form adjacent isolation trenches.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
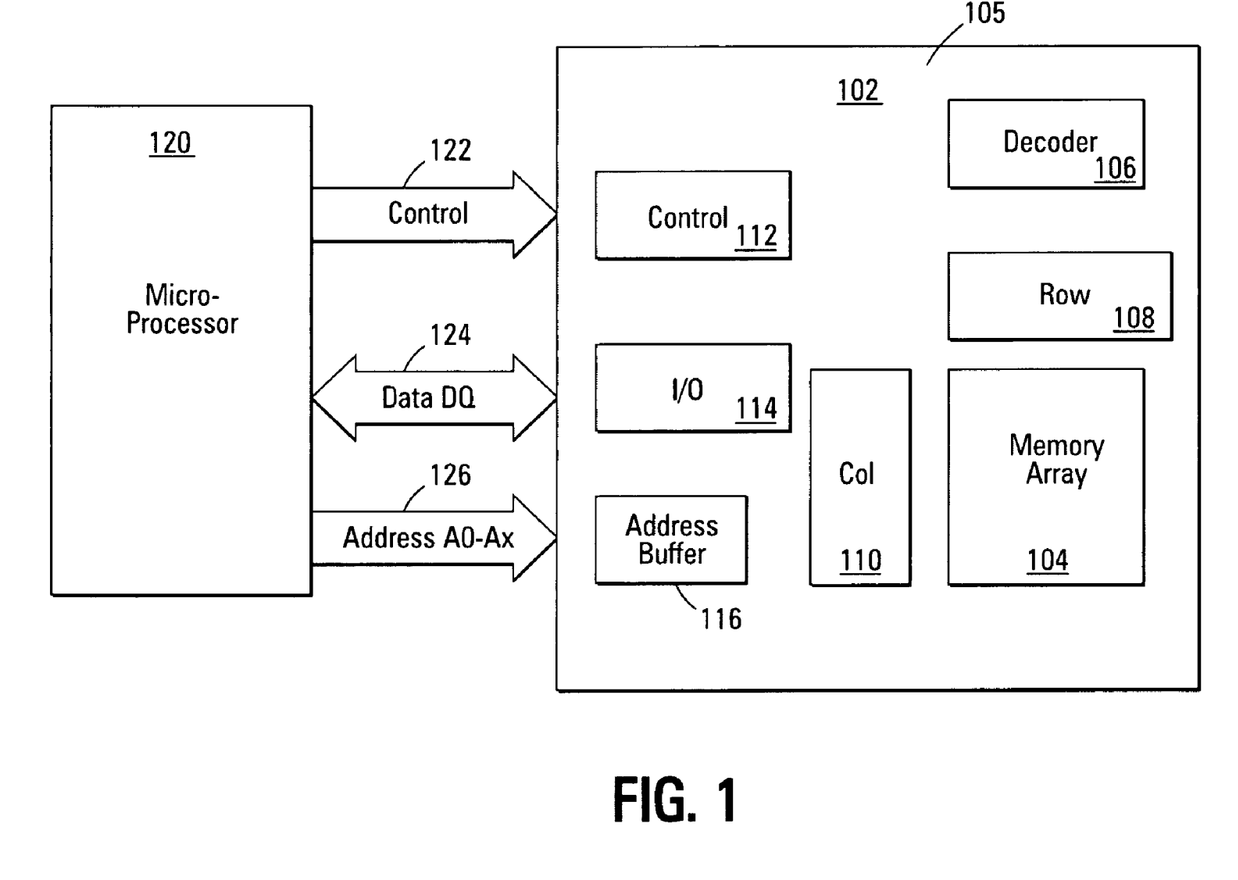
FIG. 1 is a block diagram illustration of an integrated circuit device, according to an embodiment of the invention.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND or NOR flash memory devices, dynamic random access memory devices (DRAMs), static random access memory devices (SRAMs), or the like.

For one embodiment, memory device 102 includes an array of flash memory cells 104 and a region 105 peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. The device of FIG. 1 includes isolation regions formed in accordance with an embodiment of the invention, e.g., between region 105 and memory 104 as well as within memory array 104. It will be appreciated by those skilled in the art that various integrated circuit devices include passive elements, such as capacitors, and active elements, such as transistors, and that for some embodiments such active and passive elements are formed in the periphery.

Memory device 100 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating-gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2A:
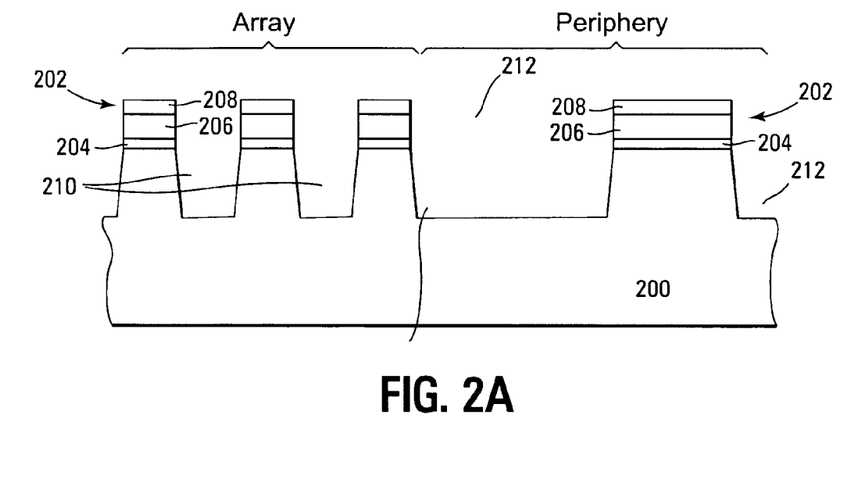
FIGS. 2A-2J are cross-sectional views of a portion of an integrated circuit device at various stages of fabrication in accordance with an embodiment of the invention.

FIGS. 2A-2J are cross-sectional views of a portion of an integrated circuit device, such as memory device 102 of FIG. 1, at various stages of fabrication in accordance with one embodiment of the invention. FIG. 2A depicts a portion of the memory device after several processing steps have occurred. The structure of FIG. 2A includes an array portion where an array of memory cells, such as of memory array 104 of memory device 102, will be formed. The structure of FIG. 2A further includes a periphery, such as the region 105 of memory device 102, where various integrated circuit elements, including passive elements, such as capacitors, and active elements, such as transistors, e.g., of row access circuitry 108 and column access circuitry 110 of memory 102 of FIG. 1, will be formed. For one embodiment, the active elements include field-effect transistors.

Formation of the type of structure depicted in FIG. 2A is well known and will not be detailed herein. In general, the array and the periphery are formed concurrently on a semiconductor substrate 200, such as a silicon-containing substrate, e.g., a monocrystalline silicon substrate, a P-type monocrystalline silicon substrate, etc. A hard mask 202 is formed overlying portions of substrate 200 in the array portion and the periphery. For one embodiment, hard mask 202 includes a sacrificial pad oxide layer 204, such as a thermal oxide or deposited silicon dioxide ($SiO_2$), formed overlying substrate 200. A nitride layer 206 of hard mask 202, such as a layer of silicon nitride, or a layer of another suitable material having a high selectivity to silicon, is formed overlying pad oxide layer 204. A cap layer 208, e.g., of tetraethylorthosilicate (TEOS), is formed overlying nitride layer 206. Trenches 210 are formed in the array portion and trenches 212 are formed in the periphery by patterning the hard mask layer 202 and removing portions of the substrate 200 exposed by the patterned hard mask 202. Trenches 210 and 212 will be filled with a dielectric material, as described below, to form isolation regions, such as shallow trench isolation (STI) regions.

Figure 2B:
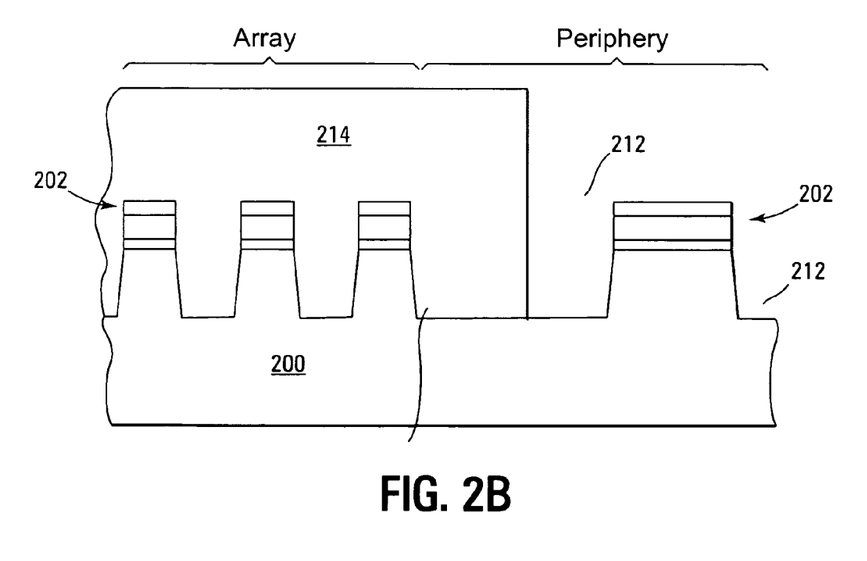
Figure 2C:
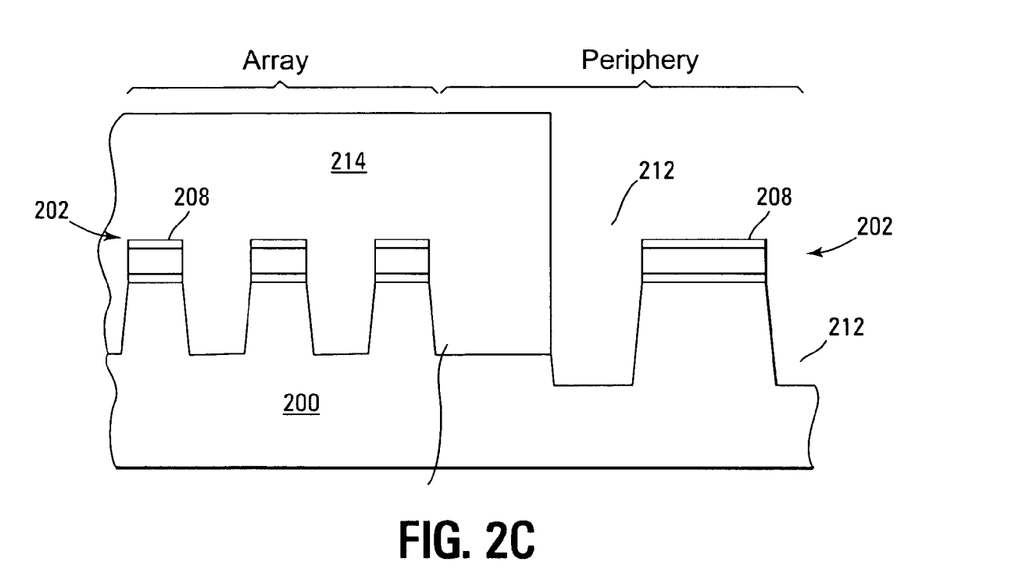

A photoresist mask layer 214 is subsequently formed overlying the array portion in FIG. 2B, while leaving at least a portion the periphery exposed, including at least a portion of one of trenches 212 and the portion of hard mask layer 202 in the periphery. Photoresist mask layer 214 protects the array while additional material of substrate 200 is removed from trenches 212 in FIG. 2C to increase the extent or depth of of trenches 212 in substrate 200, e.g., using an anisotropic etch. The exposed portion of hard mask layer 202 in the periphery protects the underlying substrate during the removal of the additional substrate material from trenches 212 for the future formation of a circuit element there. Note that the removal of the additional substrate material removes material from cap layer 208 in the periphery causing cap layer 208 to be thinner in the periphery than in the array, as shown in FIG. 2C.

Figure 2D:
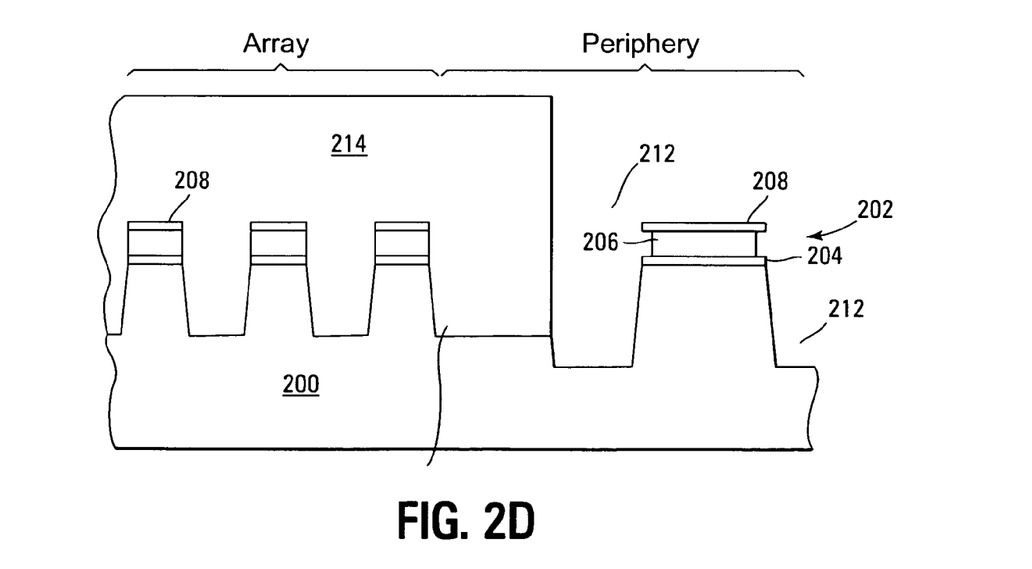

In FIG. 2D, a dry isotropic etch is performed to etch back (or recess) nitride layer 206 relative to pad oxide layer 204 and cap layer 208 of the exposed portion of hard mask layer 202 in the periphery in a direction generally parallel to an upper surface of substrate 200. This exposes portions of pad oxide layer 204, as shown in FIG. 2D. It should be noted that wet etch methods that can remove nitrides, such as phosphoric acid dips or the like, are not suitable for recessing nitride layer 206 because they act to lift photoresist mask layer 214 off the array portion.

For one embodiment, the isotropic dry etch is performed using a plasma containing an oxygen source, a hydrogen source, and a fluorine source. More specifically, for another embodiment, the isotropic dry etch is performed using a forming gas of nitrogen ($N_2$) with 3.8% hydrogen ($H_2$) by volume at a flow rate of about 700 to about 1600 standard cubic centimeters per minute (sccm), tetrafluoromethane ($CF_4$) at a flow rate from about 30 to about 200 sccm, and an oxygen ($O_2$) at a flow rate from about 40 to about 1000 sccm, at a pressure of about 0.5 to about 2.5 torr., a temperature of about 20 to about 120° C., and a microwave power of about 500 to about 3000 Watts. Nitric Oxide ($N_2O$) and $H_2$ or water ($H_2O$) and $N_2$ may be substituted for $N_2$, $H_2$, and $O_2$, for another embodiment, and trifluoromethane ($CHF_3$) or nitrogen trifluoride ($NF_3$) may be substituted for $CF_4$ for yet another embodiment.

Figure 2E:
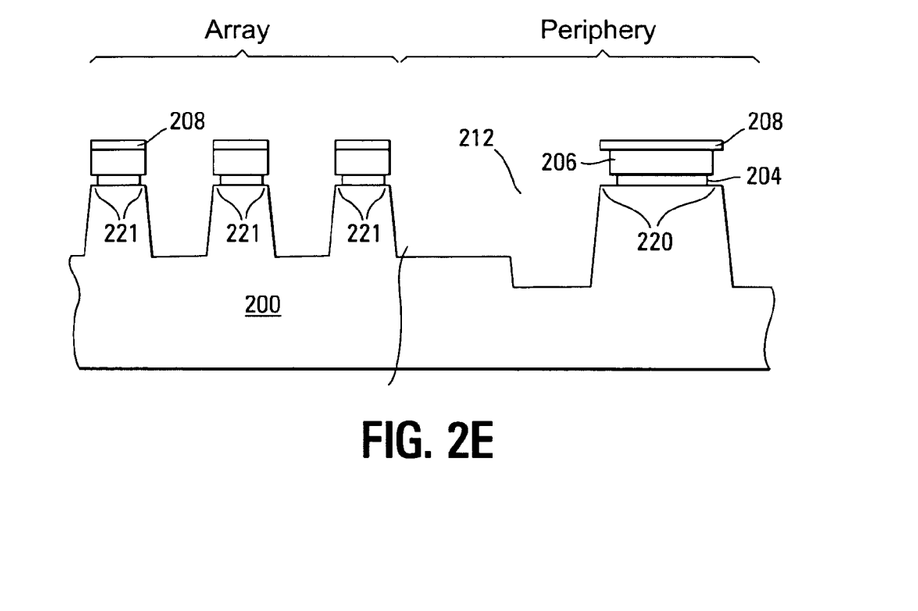
Figure 2F:
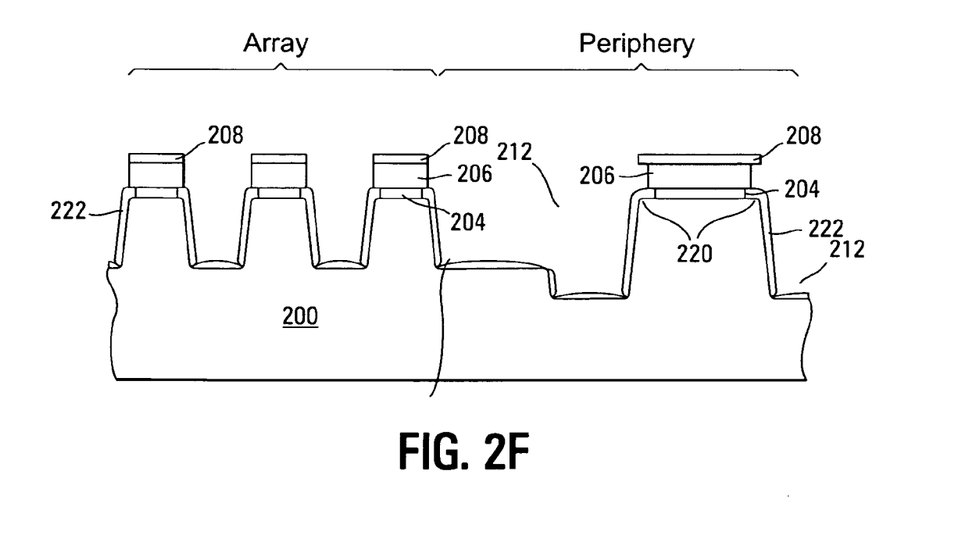

Photoresist mask layer 214 is removed, e.g., using a stripping operation, and the exposed portions of pad oxide layer 204 are subsequently removed in FIG. 2E to expose portions of substrate 200 adjacent corners 220 that are respectively adjacent trenches 212 in the periphery and adjacent corners 221 that are respectively adjacent trenches 210 in the periphery. For one embodiment, a wet etch, such as an etch using diluted hydrofluoric acid (HF) may be used to remove the exposed portions of pad oxide layer 204. An oxide liner 222 is formed on the exposed surfaces of substrate 200 by rapid thermal oxidation, for one embodiment, or with in-situ generated steam, for another embodiment, in FIG. 2F. The oxidation acts to round corners 220 and 221, as shown in FIG. 2F. Note, however, that the rounding of corners 221 is less pronounced than the rounding of corners 220, owing to the recessing of both pad oxide layer 204 and nitride layer 206 in the periphery. Rounding of corners 220 acts to reduce oxide stresses that may form in the vicinity of corners 220.

Figure 2G:
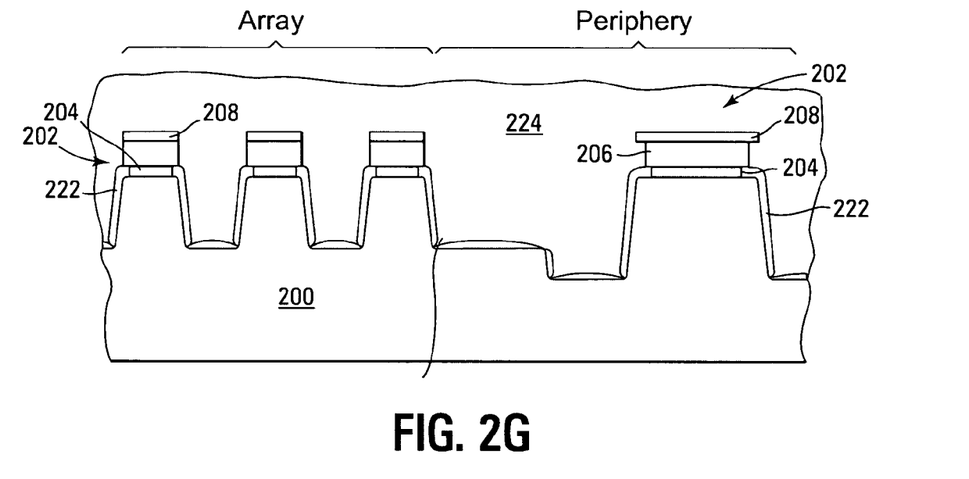

A layer of dielectric material 224 is deposited in trenches 210 and 212 and overlying protective cap layer 202 in the array portion and periphery, such as by blanket deposition, in FIG. 2G. For other embodiments, a spin-on process may be used to deposit dielectric material in trenches 210 and 212. Suitable dielectric materials may include oxides, e.g., thermal oxides and/or high-density-plasma (HDP) oxides, spin-on dielectric materials, e.g., hydrogen silsesquioxane (HSQ), hexamethyldisiloxane, octamethyltrisiloxane, etc. For some embodiments, a nitride liner is formed on oxide liner 222, before filling trenches 210 and 212 with the dielectric material.

Figure 2H:
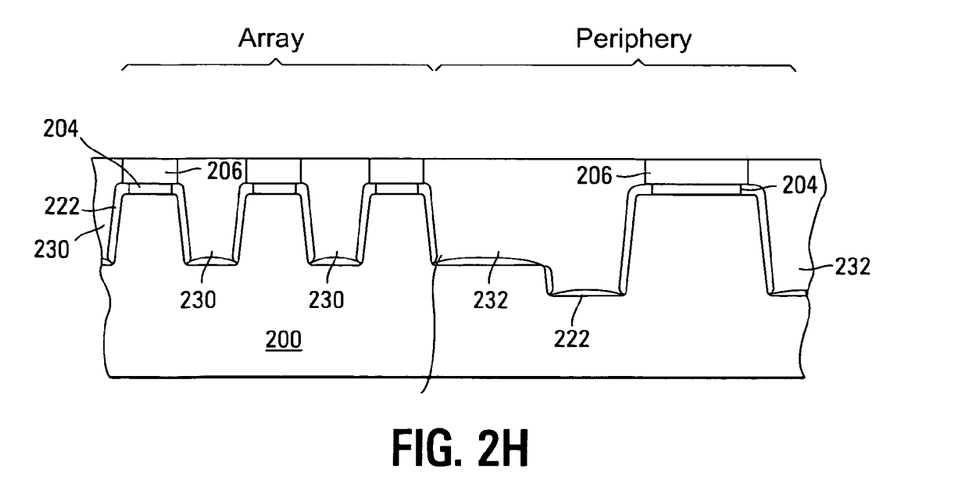

Subsequently, for one embodiment, a portion of the dielectric material 224 and cap layer 208 of hard mask 202 are removed, e.g., by chemical mechanical planerization (CMP), using the nitride layer 206 as a stopping layer, to expose an upper surface of nitride layer 206 of hard mask 202 and to respectively form isolation regions 230 and 232 in trenches 210 of the array portion and trenches 212 of the periphery in FIG. 2H.

Figure 2I:
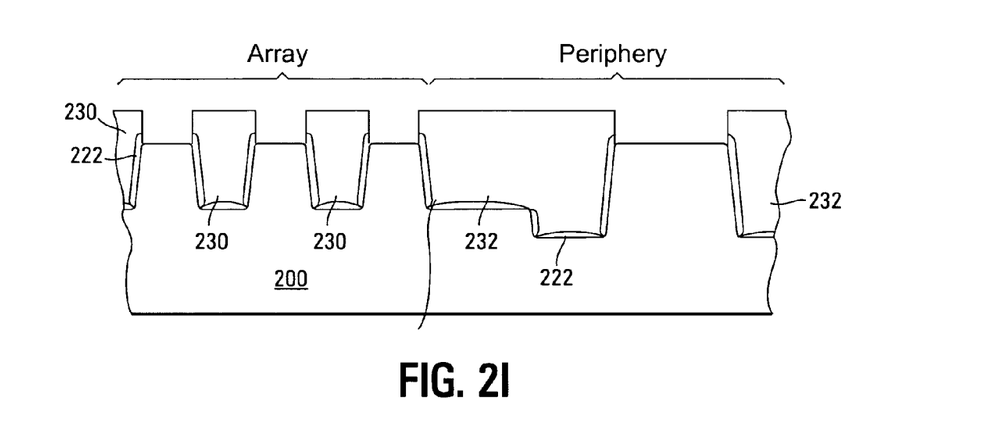

In FIG. 2I, nitride layer 206 and pad oxide layer 204 of hard mask 202 are removed, exposing portions of substrate 200 to define active regions between isolation regions 230 in the array portion over which memory cells will be formed, and active regions between isolation regions 232 in the periphery over which a circuit element, such as a field effect transistor, will be formed. Note that for the embodiment where the cap layer 208 is left after removal of the portion of the dielectric material 224, this step involves removing the entire hard mask 202.

Figure 2J:
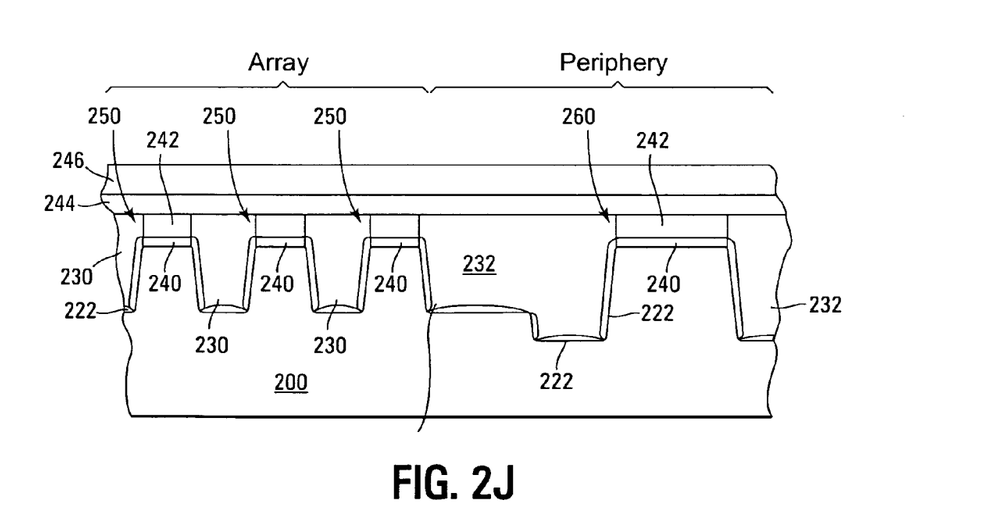

Upon exposing future active regions of substrate 200, formation of circuit elements can proceed in a manner suitable for the desired integrated circuit device. FIG. 2J provides one example for forming a memory device. Note that for various embodiments, the substrate will contain active areas having rounded corners prior to forming circuit elements thereon, with the rounding being more pronounced in the periphery.

In FIG. 2J, a first dielectric layer 240, e.g., an oxide layer, is formed on the exposed portions of substrate in the array portion and the periphery. For one embodiment, forming the first dielectric layer on the exposed portions of the substrate includes blanket depositing or thermally growing the dielectric layer. A first conductive layer 242 is subsequently formed on first dielectric layer 240. For one embodiment, first conductive layer 242 is a silicon-containing layer, preferably a polysilicon (polycrystalline silicon) layer, but could also include other forms of doped or undoped silicon materials, such as monocrystalline silicon, nanocrystalline silicon, and amorphous silicon.

A second dielectric layer 244 is formed overlying first conductive layer 242 and the isolation regions 230 and 232. Second dielectric layer 244 may be one or more layers of dielectric material. For example, the second dielectric layer 244 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties.

A second conductive layer 246 is formed overlying second dielectric layer 244. Second conductive layer 246 is generally one or more layers of conductive material. For one embodiment, the second conductive layer 246 contains a conductively-doped polysilicon. For a further embodiment, the second conductive layer 246 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, second conductive layer 246 contains multiple metal-containing layers, e.g., a titanium nitride (TiN) barrier layer overlying the second dielectric layer 244, a titanium (Ti) adhesion layer overlying the barrier layer, and a tungsten (W) layer overlying the adhesion layer. An insulative cap layer (not shown) is often formed overlying the second conductive layer 246 to protect and isolate the second conductive layer 246 from further processing.

The first conductive layer 242, the second dielectric layer 244, and the second conductive layer 246 form gate stacks. In the array portion of the memory device, the gate stacks form a part of floating gate memory cells 250, where the first dielectric layer 240 is a tunnel dielectric layer, the first conductive layer 242 is a floating gate, the second dielectric layer 244 is an intergate dielectric layer, and the second conductive layer 246 is a control gate of the memory cells 250. The second conductive layer 246 (or control gate) of the array portion is subsequently patterned to define the word lines of the memory device (not shown in FIG. 2J). Note that an isolation region 230 of the memory array portion isolates the tunnel dielectric layers and the floating gates of adjacent memory cells 250.

In the periphery, for one embodiment, the gate stacks form a part of a circuit element 260, e.g., field-effect transistor. For example, the field-effect transistor can be part of row access circuitry 108 and/or column access circuitry 110 of the memory device 102 of FIG. 1 for accessing rows and columns of the memory array 104. The first dielectric layer 240 is a gate dielectric layer, and the first conductive layer 242 and the second conductive layer 246 are portions of a control gate of the element 260, for one embodiment. For some embodiments, the first conductive layer 242 and the second conductive layer 246 may be strapped (or shorted) together so that the shorted together first conductive layer 242 and second conductive layer 246 form the control gate of the element 260. For another embodiment, the first conductive layer 242 and the second conductive layer 246 are not shorted together, and first conductive layer 242 forms the control gate of the element 260.

It is noted that FIGS. 2A-2J depict a portion of a row of memory cells running parallel to a face plane of the drawings. Columns of memory cells, separated by the isolation regions 230, run perpendicular to the drawings, with source and drain regions formed at opposing ends of the tunnel dielectric layer 240, one above the face plane of the figures and one below the face plane of the figures. It is noted that FIGS. 2A-2J can depict either a NOR-type memory device or a NAND-type memory device, with the differences occurring in the column direction in manners that are well understood in the art of memory fabrication.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated circuit device comprising:
a substrate having first and second portions;
one or more first active regions formed in the first portion of the substrate, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more first circuit elements formed on the one or more first active regions, wherein corners of the one or more first active regions have been rounded prior to forming the first circuit elements thereon;
one or more second active regions formed in the second portion of the substrate; and
one or more second circuit elements formed on the one or more second active regions.

2. A memory device comprising:
a substrate having first and second portions;
one or more first active regions formed in the first portion of the substrate, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more circuit elements formed on the one or more first active regions, wherein corners of the one or more first active regions have been rounded prior to forming the circuit elements thereon;
one or more second active regions formed in the second portion of the substrate; and
one or more memory cells formed on the one or more second active regions.

3. The memory device of claim 2 further comprises second isolation regions formed in the second portion of the substrate, wherein a second isolation region is located on either side of the one or more second active regions.

4. The memory device of claim 2, wherein the one or more memory cells are floating-gate memory cells.

5. The memory device of claim 2, wherein the one or more circuit elements are field-effect transistors.

6. The memory device of claim 2, wherein the first and second portions respectively define a periphery and a memory portion of the memory device.

7. An integrated circuit device comprising:
a substrate having first and second portions;
one or more first active regions formed in the first portion of the substrate, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more first circuit elements formed on the one or more first active regions, wherein corners of the one or more first active regions have been rounded prior to forming the first circuit elements thereon;
one or more second active regions formed in the second portion of the substrate, wherein each of the one or more second active regions has rounded corners;
a second dielectric layer formed on opposing sidewalls of the one or more second active regions;
a second isolation region formed on each of the second dielectric layers so that a sidewall of each second isolation region is flush with an end of the second dielectric layer on which that second isolation region is formed; and
one or more second circuit elements formed on the one or more second active regions.

8. A memory device comprising:
a substrate having first and second portions;
one or more first active regions formed in the first portion of the substrate, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more circuit elements formed on the one or more first active regions, wherein corners of the one or more first active regions have been rounded prior to forming the circuit elements thereon;
one or more second active regions formed in the second portion of the substrate;

a second dielectric layer formed on opposing sidewalls of the one or more second active regions;

a second isolation region formed on each of the second dielectric layers so that a sidewall of each second isolation region is flush with an end of the second dielectric layer on which that second isolation region is formed; and one or more memory cells formed on the one or more second active regions.

9. The memory device of claim 8, wherein the one or more memory cells are floating-gate memory cells.

10. The memory device of claim 8, wherein the one or more circuit elements are field-effect transistors.

11. The memory device of claim 8, wherein the first and second portions respectively define a periphery and a memory portion of the memory device.

12. A memory device comprising:
a periphery;
a memory portion;
one or more first active regions formed in the periphery, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more field-effect transistors formed on the one or more first active regions, wherein corners of the one or more first active regions have been rounded prior to forming the circuit elements thereon;
one or more second active regions formed in the memory portion; and
one or more floating-gate memory cells formed on the one or more second active regions.

13. The memory device of claim 12 further comprises second isolation regions formed in the memory portion, wherein a second isolation region is located on either side of the one or more second active regions.

14. A memory device comprising:
a periphery;
a memory portion;
one or more first active regions formed in the periphery, wherein each of the one or more first active regions has rounded corners;
a first dielectric layer formed on opposing sidewalls of the one or more first active regions;
a first isolation region formed on each of the first dielectric layers so that a sidewall of each first isolation region is flush with an end of the first dielectric layer on which that first isolation region is formed;
one or more field-effect transistors formed on the one or more first active regions, wherein corners of the one or more first active regions have been rounded prior to forming the circuit elements thereon;
one or more second active regions formed in the memory portion;
a second dielectric layer formed on opposing sidewalls of the one or more second active regions;
a second isolation region formed on each of the second dielectric layers so that a sidewall of each second isolation region is flush with an end of the second dielectric layer on which that second isolation region is formed; and one or more floating-gate memory cells formed on the one or more second active regions.

15. An electronic system comprising:
a processor; and
an integrated circuit device coupled to the processor, and comprising:
a substrate having first and second portions;
one or more first active regions formed in the first portion of the substrate, wherein each of the one or more first active regions has rounded corners;
a dielectric layer formed on opposing sidewalls of the one or more first active regions;
an isolation region formed on each of the dielectric layers so that a sidewall of each first isolation region is flush with an end of the dielectric layer on which that isolation region is formed;
one or more first circuit elements formed on the one or more first active regions, wherein corners of the one or more first active regions have been rounded prior to forming the first circuit elements thereon;
one or more second active regions formed in the second portion of the substrate; and
one or more second circuit elements formed on the one or more second active regions.

16. An electronic system comprising:
a processor; and
a memory device coupled to the processor, and comprising:
a substrate having first and second portions;
one or more first active regions formed in the first portion of the substrate, wherein each of the one or more first active regions has rounded corners;
a dielectric layer formed on opposing sidewalls of the one or more first active regions;
an isolation region formed on each of the dielectric layers so that a sidewall of each first isolation region is flush with an end of the dielectric layer on which that isolation region is formed;
one or more circuit elements formed on the one or more first active regions, wherein corners of the one or more first active regions have been rounded prior to forming the circuit elements thereon;
one or more second active regions formed in the second portion of the substrate; and
one or more memory cells formed on the one or more second active regions.

17. The integrated circuit device of claim 1, wherein each of the one or more second active regions has rounded corners.

18. The integrated circuit device of claim 1, wherein the first dielectric layer is an oxide layer.

19. The integrated circuit device of claim 1 further comprises:
a second dielectric layer formed on opposing sidewalls of the one or more second active regions; and
a second isolation region formed on each of the second dielectric layers so that a sidewall of each second isolation region is flush with an end of the second dielectric layer on which that second isolation region is formed.

20. The integrated circuit device of claim 7, wherein the first and second dielectric layers are oxide layers.

21. The memory device of claim 8, wherein each of the one or more second active regions has rounded corners.

* * * * *